United States Patent
Koide

(10) Patent No.: US 8,936,706 B2
(45) Date of Patent: Jan. 20, 2015

(54) SPUTTERING TARGET WITH LOW GENERATION OF PARTICLES

(75) Inventor: Kei Koide, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 631 days.

(21) Appl. No.: 12/935,014

(22) PCT Filed: Mar. 27, 2009

(86) PCT No.: PCT/JP2009/056299
§ 371 (c)(1),
(2), (4) Date: Sep. 28, 2010

(87) PCT Pub. No.: WO2009/123055
PCT Pub. Date: Oct. 8, 2009

(65) Prior Publication Data
US 2011/0048935 A1 Mar. 3, 2011

(30) Foreign Application Priority Data
Apr. 3, 2008 (JP) ................................. 2008-096806

(51) Int. Cl.
*C23C 14/34* (2006.01)
*C23C 14/06* (2006.01)

(52) U.S. Cl.
CPC .......... *C23C 14/3414* (2013.01); *C23C 14/0688* (2013.01)
USPC ................................. 204/298.12; 204/298.13

(58) Field of Classification Search
USPC ......................................... 204/298.12, 298.13
See application file for complete search history.

(56) References Cited

U.S. PATENT DOCUMENTS

| | | | |
|---|---|---|---|
| 4,895,592 A | 1/1990 | Hatwar et al. | |
| 5,460,793 A | 10/1995 | Kano et al. | |
| 5,630,918 A | 5/1997 | Takahara et al. | |
| 5,632,869 A * | 5/1997 | Hurwitt et al. | 204/192.12 |
| 6,024,852 A | 2/2000 | Tamura et al. | |
| 6,033,620 A * | 3/2000 | Utsumi et al. | 264/674 |
| 6,153,315 A | 11/2000 | Yamakoshi et al. | |
| 6,521,062 B1 | 2/2003 | Bartholomeusz et al. | |
| 7,909,949 B2 * | 3/2011 | Nakamura et al. | 148/557 |
| 2005/0239660 A1 * | 10/2005 | Abe et al. | 505/475 |
| 2007/0125645 A1 * | 6/2007 | Nakamura et al. | 204/298.12 |
| 2007/0187236 A1 | 8/2007 | Nakamura et al. | |
| 2009/0242393 A1 | 10/2009 | Satoh | |
| 2010/0320084 A1 | 12/2010 | Sato | |
| 2011/0132757 A1 | 6/2011 | Nakamura et al. | |
| 2011/0162971 A1 | 7/2011 | Nakamura et al. | |
| 2011/0247930 A1 | 10/2011 | Sato | |
| 2011/0284373 A1 | 11/2011 | Sato et al. | |
| 2012/0241317 A1 | 9/2012 | Ikeda et al. | |
| 2012/0273347 A1 | 11/2012 | Koide | |

FOREIGN PATENT DOCUMENTS

| | | | |
|---|---|---|---|
| JP | 03-257158 A | | 11/1991 |
| JP | 2001-316808 A | | 11/2001 |
| JP | 2001316808 A | * | 11/2001 |
| JP | 2002-069623 A | | 3/2002 |
| JP | 2002-208125 A | | 7/2002 |
| JP | 2006-176808 A | | 7/2006 |
| JP | 2007-031808 A | | 2/2007 |

OTHER PUBLICATIONS

Machine Tranlsation to Yabe (JP 2001316808 A) published Nov. 2001.*
JIS B 0631, "Geometrical Product Specification (GPS)—Surface texture: Profile method—Motif Parameters", Mar. 2000.
JIS B 0601, "Geometrical Product Specification (GPS)—Surface texture: Surface texture: Profile method—Terms, definitions and surface texture parameters", Mar. 2013.

* cited by examiner

Primary Examiner — John Brayton
(74) Attorney, Agent, or Firm — Howson & Howson LLP

(57) ABSTRACT

Provided is a sputtering target with low generation of particles having a target surface in which intermetallic compounds, oxides, carbides, carbonitrides and other substances without ductility exist in a highly ductile matrix phase at a volume ratio of 1 to 50%, wherein a center-line average surface roughness Ra is 0.1 µm or less, a ten-point average roughness Rz is 0.4 µm or less, a distance between local peaks (roughness motif) AR is 120 µm or less, and an average length of waviness motif AW is 1500 µm or more. Provided are a sputtering target wherein the generation of nodules and particles upon sputtering can be prevented or inhibited by improving the target surface, which contains large amounts of substances without ductility; and a surface processing method thereof.

19 Claims, No Drawings

SPUTTERING TARGET WITH LOW GENERATION OF PARTICLES

BACKGROUND OF THE INVENTION

The present invention relates to a sputtering target with low generation of particles, and to the surface processing method thereof.

The sputtering method is a well-known technique as a means for forming a thin film. The basic principle thereof is to apply voltage, in lean gas such as argon, between a substrate (anode side) on which the thin film is formed and a target (cathode side) which is formed from a film-forming substance and placed opposite the substrate at a close distance, so as to change argon gas into a plasma. As a result, the argon ions generated thereby collide with the target, which is a cathode material, the energy thereof discharges (knocks off) the target material outside, and the discharged material is laminated on the opposed substrate surface.

A thin film forming device employing this sputtering principle includes various modified types such as a bipolar bias sputtering device, high-frequency sputtering device, and plasma sputtering device, but all of these devices employ the same basic principle.

The material for forming the thin film is referred to as a target, since it becomes the target for the argon ions. Since sputtering results from the energy of ion collision, the thin film forming material constituting the target is laminated on the substrate in an atomic state, or a cluster state in which the atoms assemble. As a result, a fine and precise thin film can be formed, and this is the reason it is being widely used in various electronic components today.

Recently, this sputtering used for forming thin films is being demanded of extremely sophisticated deposition methods, and an important task is to form films with few defects.

The generation of such defects in this sputtering is not only attributable to the sputtering method, but is also often caused by the target itself. As a cause of such defect generation arisen from the target, there is the generation of particles and nodules.

Under normal conditions, the materials sputtered (discharged) from the target will adhere to the opposed substrate, but the materials are not necessarily sputtered perpendicularly, and are discharged in various directions. This kind of discharged material will adhere to the components inside the sputtering device other than the substrate, and at some point, this will peel off, float, and reattach to the substrate.

This kind of material is referred to as particles, and this is not an originally scheduled thin film forming material. Further, since such particles often adhere as a large cluster, for instance, these particles will cause a short circuit in the fine wiring film for electronic components, and lead to the generation of defective products. It has been discovered that the generation of such particles is due to discharged materials from the target and will increase or decrease according to the surface condition of the target.

Further, generally speaking, materials of the target face do not decrease (erode) evenly due to the sputtering, and the tendency is that a specific area, in a ring shape for example, is eroded according the inherent characteristics of the constituent material and sputtering device, way of applying voltage, and so on. Moreover, depending on the type of target material or the manufacturing method of the target, protrusive substances with numerous bumps known as nodules may be formed on the target.

Since this is one of the thin film forming materials, it will not directly affect the thin film. Nevertheless, minute arcs (microarcing) will occur to the protrusions of the nodules, and it has been observed that this results in the increase of particles.

Further, when numerous nodules are generated, the sputtering rate will change (become delayed), and it will not be possible to control the deposition. At times, these rough and large nodules may peel off and adhere to the substrate.

In such a case, the nodules themselves will become a significant obstacle. Thus, it is sometimes necessary to temporarily stop the sputtering process to remove the nodules. This results in a problem of deteriorating the operation efficiency.

Recently, a target is not formed from a uniform material, and is often used in a state where intermetallic compounds, oxides, carbides, carbonitrides and other substances are mixed in a ductile matrix phase. Here, there is a problem in that the generation of nodules and particles will increase.

As conventional technology, disclosed is a sputtering target in which the processing defect layer (fracture layer) containing minute cracks and defective parts arising during the machine work is removed from the surface of a sputtering target for high-melting-point metal alloy (c.f. Patent Document 1); and a technique for uniformizing the film and inhibiting the generation of nodules and particles by adjusting the surface roughness of the sputtering target so as to reduce the amount of residual contamination, hydrogen content on the surface, and thickness of the affected layer (c.f. Patent Document 2).

Nevertheless, according to these Documents, although it is anticipated that the generation of nodules and particles considerably affects the surface condition of the target, the actual situation is that they are unable to resolve the foregoing problems.

[Patent Document 1]
Japanese Laid-Open Patent Publication No. H3-257158
[Patent Document 2]
Japanese Laid-Open Patent Publication No. H11-1766

SUMMARY OF THE INVENTION

An object of the present invention is to provide a sputtering target with superior surface characteristics that is able to prevent or inhibit the generation of nodules and particles upon sputtering by improving the target surface in which intermetallic compounds, oxides, carbides, carbonitrides and other substances without ductility exist in a highly ductile matrix phase; and the surface processing method thereof.

The present invention provides: 1) a sputtering target with low generation of particles having a target surface in which intermetallic compounds, oxides, carbides, carbonitrides and other substances without ductility exist in a highly ductile matrix phase at a volume ratio of 1 to 50%, wherein a centerline average surface roughness Ra is 0.1 µm or less, a ten-point average roughness Rz is 0.4 µm or less, a distance between local peaks (roughness motif) AR is 120 µm or less, and an average length of waviness motif AW is 1500 µm or more; and 2) the sputtering target according to 1) above, wherein intermetallic compounds, oxides, carbides, carbonitrides and other substances without ductility existing in a highly ductile matrix phase have the average grain size of at least 0.5 to 50 µm.

The present invention additionally provides: 3) a surface processing method of a sputtering target with low generation of particles, wherein a target surface in which intermetallic compounds, oxides, carbides, carbonitrides and other substances without ductility exist in a highly ductile matrix phase at a volume ratio of 1 to 50% is preliminarily subject to the primary processing of cutting work, and then subject to finish processing via polishing in order to form a smooth surface in which the center-line average surface roughness Ra is 0.1 μm or less, the ten-point average roughness Rz is 0.4 μm or less, the distance between local peaks (roughness motif) AR is 120 μm or less, and the average length of waviness motif AW is 1500 μm or more; 4) the surface processing method of a sputtering target according to 3) above, wherein the primary processing of cutting work is performed to cut an area of 1 mm to 10 mm from the surface of the target material; and 5) the surface processing method of a sputtering target according to 3) or 4) above, wherein the finish processing via polishing is performed to polish an area of 1 μm to 50 μm from the surface after being subject to the primary processing of cutting work.

With the present invention, as a result of preliminarily subjecting a target surface, in which intermetallic compounds, oxides, carbides, carbonitrides and other substances without ductility exist in a highly ductile matrix phase at a volume ratio of 1 to 50%, to the primary processing of cutting work, and subsequently subjecting it to finish processing via polishing, a target with a smooth surface and superior surface characteristics can be obtained. As a result of sputtering with this target, a significant effect is yielded in that the generation of particles and the generation of nodules after the use of the target can be significantly reduced.

DETAILED DESCRIPTION OF THE INVENTION

The target subject to the surface processing of the present invention is a target in which intermetallic compounds, oxides, carbides, carbonitrides and other substances without ductility are mixed in a highly ductile matrix phase at a volume ratio of 1 to 50%. A typical example of the foregoing target is a magnetic material, and Co, Cr, Pt, B and the like may be used as a ductile substance. Nevertheless, it goes without saying that the present invention is not limited to the foregoing materials, and may be applied to other similar materials.

For example, when this kind of target material with substances without ductility being mixed therein is subject to cutting work with a cutting tool; taking the location where intermetallic compounds, oxides, carbides, carbonitrides and other substances without ductility exist as the point of origin, defects (dents) in the form of cracks, indentations caused by fallouts, or in some cases fragments remaining in the indentation will be formed.

This kind of surface defect often occurs even when the portions of materials without ductility having an average grain size of 0.5 to 50 μm or more are evenly and finely dispersed. Further, when the hardness thereof is measured, it often seems to be that the Vickers hardness of the highly ductile matrix phase is 400 or less, the Vickers hardness of the intermetallic compounds, oxides, carbides, carbonitrides and other substances without ductility is 400 or more, and the hardness difference is 1.5 times.

Therefore, the surface processing method of the present invention is particularly effective in the foregoing case.

In the present invention, after performing the primary processing of cutting an area of preferably 1mm to 10mm from the surface of target material, the finishing processing via polishing is subsequently performed. The reason for cutting an area of 1mm to 10mm is to effectively remove the defects on the target material surface. It is desirable to perform cutting via lathe processing with a tool bit. As a result of this cutting work (primary processing), defects such as cracks and indentations caused by fallouts as described above are generated, but such defects are polished with sandpaper or a grindstone having a rough grain size of, for instance #80 to #400. Thereby, the foregoing defects such as cracks and indentations caused by fallouts are eliminated, and a flat and smooth target face is formed. Sandpaper or a grindstone having a rough grain size of #80 to #400 is able to effectively eliminate the defects originating from intermetallic compounds, oxides, carbides, carbonitrides, and other substances without ductility generated from the cutting work, and is an optimum range for smoothing the surface including a ductile matrix phase. Here, there is no need to perform mirror polishing, and it will suffice so as long as the fallout of cracks and indentations can be removed.

When preparing a flat and smooth target without surface defects such as cracks and indentations caused by fallouts, it is perceived that the target material is polished with sandpaper or a grindstone having a rough grain size of #80 to #400 from the start. Nevertheless, in such a case, there is a problem in that the amount of time required for polishing processing will be enormous, and the maintenance frequency of the grindstone will increase due to adherence of the substances of a highly ductile matrix to the grindstone. In addition, particularly with manual polishing processing, even if there may not be a significant difference in the surface roughness, there is a tendency that the outer periphery and center portion are polished more, and there is a problem in that an undulation will occur on the target surface. Therefore, in reality, it is impossible to only perform polishing processing, without performing cutting work, for the surface processing of the target. In the present invention, a target material is subject to primary processing of cutting with lathe in order to obtain a target shape, and subsequently subject to SSP (Sputtering Target Surface Polishing) including the steps of [→][→] wet primary polishing based on dropping of pure water → wet secondary polishing based on dropping of alumina abrasive agent. It is thereby possible to achieve a center-line average surface roughness Ra of 0.1μm or less, a ten-point average roughness Rz of 0.4μm or less, a distance between local peaks (roughness motif) AR of 120μm or less, and an average length of waviness motif AW of 1500μm or more; and obtain a target surface that is flat and extremely smooth. Since the center-line average surface roughness Ra, the ten-point average roughness Rz, the distance between local peaks (roughness motif) AR and the average length of waviness motif AW are definitions of the surface roughness standardized with JIS (refer to JIS B0601, and JIS B0631), the explanation thereof is omitted.

What is important in the present invention is to achieve a center-line average surface roughness Ra of 0.1 μm or less, a ten-point average roughness Rz of 0.4 μm or less, a distance between local peaks (roughness motif) AR of 120 μm or less, and an average length of waviness motif AW of 1500 μm or more in order obtain a sputtering target with a smooth surface.

It is thereby possible to improve the surface of a target in which intermetallic compounds, oxides, carbides, carbonitrides and other substances without ductility exist in a highly ductile matrix phase, and thereby yield a significant effect of being able to prevent or inhibit the generation of nodules and particles during sputtering.

EXAMPLES AND COMPARATIVE EXAMPLES

Next, the Examples of the present invention are explained. These Examples are merely illustrative, and the present invention shall not in any way be limited by such Examples.

Example 1

In Example 1, Co, Cr, Pt, B were used as the raw material; and a target material manufactured by the manufacturing process including melting and rolling was subject to primary polishing of cutting with a lathe in order to obtain a target shape, and subsequently subject to SSP (Sputtering Target Surface Polishing) including the steps of [→] wet primary polishing based on dropping of pure water → wet secondary polishing based on dropping of alumina abrasive agent in order to adjust the surface and obtain a target. With regard to the average surface roughness of the target of which the surface roughness was adjusted as described above; the measurement results of the center-line average surface roughness Ra, the ten-point average roughness Rz, the distance between local peaks (roughness motif) AR, and the average length of waviness motif AW are shown in Table 1. The measurement points were the three points on the target surface, and the values shown in Table 1 are the average value of the three points. As shown in Table 1, Ra was 0.053μm, Rz was 0.337μm, AR was 119.87μm, and AW was 1567.40μm. All of these results were in the range of the present invention; that is, the center-line average surface roughness Ra of 0.1μm or less, the ten-point average roughness Rz of 0.4μm or less, the distance between local peaks (roughness motif) AR of 120μm or less, and the average length of waviness motif AW of 1500μm or more; and it was possible to obtain an extremely smooth target surface with minimal surface roughness.

Subsequently, this target was used to form a sputtered film on a substrate in an Ar 1.5 Pa atmosphere under the DC sputtering condition of 30 w/cm$^2$.

When observing the particles that were generated during the sputtering, the size of the particles was approximately 20 μm×20 μm ("long diameter×short diameter"; hereinafter the same) or under, and there was hardly any difference in comparison to the grain size of oxides of approximately 10 μm×10 μm. The peeling rate decreased considerably. The results are also shown in Table 1. In addition, it was possible to reduce the occurrence of defectives caused by the particles to 1.8%.

TABLE 1

|  | Ra (μm) | Rz (μm) | AR (μm) | AW (μm) | Size of Particles (μm) | Peeling % |
|---|---|---|---|---|---|---|
| Example 1 | 0.053 | 0.337 | 119.87 | 1567.40 | 20 × 20 | 1.8 |
| Comparative Example 1 | 1.633 | 7.387 | 180.40 | 1115.47 | 100 × 20 | 28 |
| Comparative Example 2 | 0.333 | 2.047 | 171.10 | 1215.00 | 40 to 100 × 20 | 11.4 |

Comparative Example 1

In Comparative Example 1, Co, Cr, Pt and B were used as the raw material as with Example 1, a target manufactured under the manufacturing conditions including melting and rolling was used, and primary processing of cutting with a lathe was performed. The amount cut in this case was 0.5 mm. Polishing processing was not performed subsequently.

The average surface roughness of this target; specifically, the measurement results of the center-line average surface roughness Ra, the ten-point average roughness Rz, the distance between local peaks (roughness motif) AR, and the average length of waviness motif AW are also shown in Table 1. The measurement points were the three points on the target surface, and the values shown in Table 1 are the average value of the three points.

As shown in Table 1, Ra was 1.633 μm, Rz was 7.387 μm, AR was 180.40 μm, and AW was 1115.47 μm. All of these results were considerably outside the range of the present invention; that is, the center-line average surface roughness Ra is 0.1 μm or less, the ten-point average roughness Rz is 0.4 μm or less, the distance between local peaks (roughness motif) AR is 120 μm or less, and the average length of waviness motif AW is 1500 μm or more; and the obtained target surface had considerable surface roughness and severe unevenness.

Subsequently, this target was used to form a sputtered film on a substrate in an Ar 1.5 Pa atmosphere under the DC sputtering condition of 30 w/cm$^2$.

When observing the particles that were generated during the sputtering, particles with a size of approximately 20 μm×100 μm had generated, and numerous peeling occurred. The results are also shown in Table 1. Moreover, the occurrence of defectives caused by the particles increased to approximately 20%.

Comparative Example 2

After performing the primary processing of cutting using a lathe as in Comparative Example 1, surface grinding processing was performed to prepare a target. The other conditions were the same as Comparative Example 1.

The average surface roughness of this target; specifically, the measurement results of the center-line average surface roughness Ra, the ten-point average roughness Rz, the distance between local peaks (roughness motif) AR, and the average length of waviness motif AW are also shown in Table 1. The measurement points were the three points on the target surface, and the values shown in Table 1 are the average value of the three points.

As shown in Table 1, Ra was 0.333 μm, Rz was 2.047 μm, AR was 171.10 μm, and AW was 1215.00 μm. Although some improvement can be seen in comparison to the case of only performing lathe processing; all of these results were considerably outside the range of the present invention; that is, the center-line average surface roughness Ra is 0.1 μm or less, the ten-point average roughness Rz is 0.4 μm or less, the distance between local peaks (roughness motif) AR is 120 μm or less, and the average length of waviness motif AW is 1500 μm or more; and the obtained target surface had considerable surface roughness and severe unevenness.

Subsequently, this target was used to form a sputtered film on a substrate in an Ar 1.5 Pa atmosphere under the DC sputtering condition of 30 w/cm$^2$.

When observing the particles that were generated during the sputtering, particles with a size of approximately 20 μm× (40 to 100) μm had generated, and numerous peeling occurred. The results are also shown in Table 1. Moreover, the occurrence of defectives caused by the particles increased to approximately 15%.

As evident from the comparison between Example 1 and Comparative Examples 1 and 2, the surface roughness was considerably small and a smooth surface was formed in Example 1. It can be confirmed that the number of nodules and the size of particles generated after sputtering the target, which are especially problematic in forming a thin film, were reduced, there was less peeling of the particles, and the level of defectiveness caused by the generation of particles was reduced.

Accordingly, it is evident that the surface processing method including cutting work and polishing process of the present invention yields superior effects in the surface processing of a target in which intermetallic compounds, oxides, carbides, carbonitrides and other substances without ductility exist in a highly ductile matrix phase at a volume ratio of 1 to 50%.

The present invention is able to obtain a target with superior surface characteristics by achieving a center-line average surface roughness Ra of 0.1 μm or less, a ten-point average roughness Rz of 0.4 μm or less, a distance between local peaks (roughness motif) AR of 120 μm or less, and an average length of waviness motif AW of 1500 μm or more. As a result of performing sputtering with this target, a superior effect is yielded in that the generation of particles and the generation of nodules after the use of the target can be significantly reduced. Accordingly, the present invention is particularly effective for a target in which intermetallic compounds, oxides, carbides, carbonitrides and other substances without ductility exist in a highly ductile matrix phase at a volume ratio of 1 to 50%.

The invention claimed is:

1. A sputtering target capable of suppressing generation of particles, comprising a target body having an exposed sputtering face consisting of a target surface having a center-line average surface roughness, Ra, of 0.1 μm or less, a ten-point average roughness, Rz, of 0.4 μm or less, an average length of roughness motif, AR, of 120 μm or less, and an average length of waviness motif AW of 1500 μm or more, said target body being made of a first substance forming a matrix phase of said target body, said target body containing at least one second substance forming at least one granular phase dispersed within said matrix phase at a volume percentage of 1 to 50% of a total volume of said target body, said matrix phase having a Vickers hardness of 400 Hv or less and being ductile relative to said at least one granular phase which has a Vickers hardness greater than that of said matrix phase and which is brittle relative to said matrix phase.

2. A sputtering target according to claim 1, wherein said at least one second substance is selected from the group consisting of inter metallic compounds, oxides, carbides, and carbonitrides, and wherein said at least one granular phase has an average grain size of 0.5 to 50 μm.

3. A surface processing method of a sputtering target capable of suppressing generation of particles, comprising the steps of:
providing a body made of a first substance forming a matrix phase of the body within which at least one second substance in a form of a granular phase is dispersed, the granular phase forming a volume percentage of 1 to 50% of a total volume of the body, and the matrix phase having a Vickers hardness of 400 Hy or less and being ductile relative to the granular phase which has a Vickers hardness greater than that of the matrix phase and which is brittle relative to the matrix phase,
preliminarily subjecting the body to primary processing of cutting work, and
after said preliminarily subjecting step, subjecting the body to finishing processing of primary wet polishing using droppings of pure water and secondary wet polishing using droppings of alumina abrasive agent to faun a sputtering target having a surface with a center-line average surface roughness, Ra, of 0.1 μm or less, a ten-point average roughness, Rz, of 0.4 μm or less, an average length of roughness motif, AR, of 120 μm or less, and an average length of waviness motif, AW, of 1500 μm or more.

4. The surface processing method of a sputtering target according to claim 3, wherein the primary processing of cutting work is performed to cut a surface layer of a thickness within a range of 1 mm to 10 mm off of a surface of the body.

5. The surface processing method of a sputtering target according to claim 4, wherein the finish processing of primary and secondary wet polishing is performed to polish and remove a surface layer of a thickness within a range of 1 μm to 50 μm from a surface of the body having been subject to the primary processing of cutting work.

6. The surface processing method of a sputtering target according to claim 3, wherein the finish processing of primary and secondary wet polishing is performed to polish and remove a surface layer of a thickness within a range of 1 μm to 50 μm from a surface of the body having been subject to the primary processing of cutting work.

7. The method according to claim 3, wherein the at least one second substance is selected from the group consisting of intermetallic compounds, oxides, carbides, and carbonitrides.

8. The method according to claim 7, wherein the granular phase has a Vickers hardness of 400 Hv or more.

9. The method according to claim 8, wherein the granular phase has a Vickers hardness that is 1.5 times the Vickers hardness of the matrix phase.

10. The method according to claim 8, wherein the matrix phase is made of at least one of Co, Cr, Pt and B.

11. The sputtering target according to claim 2, wherein said at least one granular phase has a Vickers hardness of 400 Hv or more.

12. The sputtering target according to claim 11, wherein said at least one granular phase has a Vickers hardness that is 1.5 times the Vickers hardness of said matrix phase.

13. The sputtering target according to claim 12, wherein said matrix phase is made of at least one of Co, Cr, Pt and B.

14. The sputtering target according to claim 12, wherein said matrix phase is made of Co, Cr, Pt and B.

15. The sputtering target according to claim 1, wherein said at least one second substance is selected from the group consisting of intermetallic compounds, oxides, carbides and carbonitrides.

16. The sputtering target according to claim 1, wherein said at least one granular phase has a Vickers hardness of 400 Hv or more.

17. The sputtering target according to claim 1, wherein said at least one granular phase has a Vickers hardness that is 1.5 times the Vickers hardness of said matrix phase.

18. The sputtering target according to claim 1, wherein said matrix phase is made of at least one of Co, Cr, Pt and B.

19. The sputtering target according to claim 1, wherein said matrix phase is made of Co, Cr, Pt and B.

* * * * *

UNITED STATES PATENT AND TRADEMARK OFFICE
CERTIFICATE OF CORRECTION

PATENT NO. : 8,936,706 B2
APPLICATION NO. : 12/935014
DATED : January 20, 2015
INVENTOR(S) : Kei Koide Page 1 of 1

It is certified that error appears in the above-identified patent and that said Letters Patent is hereby corrected as shown below:

In the claims,

Column 7, line 54, "faun" should read "form"

Signed and Sealed this
Twenty-eighth Day of April, 2015

Michelle K. Lee
*Director of the United States Patent and Trademark Office*